United States Patent
Hijzen et al.

(10) Patent No.: US 7,538,337 B2
(45) Date of Patent: May 26, 2009

(54) NANOWIRE SEMICONDUCTOR DEVICE

(75) Inventors: Erwin A. Hijzen, Blanden (BE); Erik P. A. M. Bakkers, Heeze (NL); Raymond J. E. Hueting, Hengelo (NL); Abraham R. Balkenende, Heeze (NL)

(73) Assignee: NXP B.V., Eindhoven (NL)

( * ) Notice: Subject to any disclaimer, the term of this patent is extended or adjusted under 35 U.S.C. 154(b) by 186 days.

(21) Appl. No.: 11/629,657

(22) PCT Filed: Jun. 7, 2005

(86) PCT No.: PCT/IB2005/051843

§ 371 (c)(1),
(2), (4) Date: Dec. 15, 2006

(87) PCT Pub. No.: WO2005/124872

PCT Pub. Date: Dec. 29, 2005

(65) Prior Publication Data

US 2008/0029909 A1 Feb. 7, 2008

(30) Foreign Application Priority Data

Jun. 15, 2004 (GB) ................. 0413310.4

(51) Int. Cl.
*H01L 29/04* (2006.01)
*H01L 47/00* (2006.01)
(52) U.S. Cl. ................ 257/3; 977/700; 977/701; 977/707; 977/720; 977/721; 977/722; 977/723; 977/742; 977/762; 977/938
(58) Field of Classification Search ............ 257/3; 977/700–701, 707, 720, 762, 721–723, 742, 977/938
See application file for complete search history.

(56) References Cited

U.S. PATENT DOCUMENTS

| 7,012,441 | B2 * | 3/2006 | Chou et al. ............ 324/754 |
| 7,056,446 | B2 * | 6/2006 | Nagase et al. ........... 216/57 |
| 7,084,507 | B2 * | 8/2006 | Awano ................. 257/773 |
| 7,132,677 | B2 * | 11/2006 | Kim et al. ............. 257/14 |
| 7,157,990 | B1 * | 1/2007 | Adam et al. ............ 333/186 |
| 7,217,650 | B1 * | 5/2007 | Ng et al. .............. 438/622 |
| 7,274,078 | B2 * | 9/2007 | Jaiprakash et al. ....... 257/414 |
| 7,291,284 | B2 * | 11/2007 | Mirkin et al. ........... 216/41 |
| 7,335,603 | B2 * | 2/2008 | Mancevski ............ 438/758 |

(Continued)

FOREIGN PATENT DOCUMENTS

DE 102 50 984 5/2004

(Continued)

*Primary Examiner*—Ida M Soward
(74) *Attorney, Agent, or Firm*—Peter Zawilski

(57) ABSTRACT

Semiconductor devices may be fabricated using nanowires. In an example embodiment, a conductive gate may be used to control conduction along the nanowires, in which case one of the contacts is a drain and the other a source. The nanowires may be grown in a trench or through-hole in a substrate or in particular in an epitaxial layer on substrate. In another example embodiment, the gate may be provided only at one end of the nanowires. The nanowires can be of the same material along their length; alternatively different materials can be used, especially different materials adjacent to the gate and between the gate and the base of the trench.

17 Claims, 4 Drawing Sheets

U.S. PATENT DOCUMENTS

Figure 1:
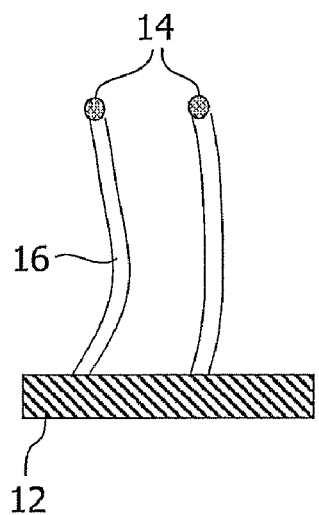

| | | |
|---|---|---|
| 7,466,523 B1 * | 12/2008 | Chen ........................ 360/324.1 |
| 2002/0175408 A1 | 11/2002 | Majumdar et al. |
| 2003/0227015 A1 | 12/2003 | Choi et al. |
| 2005/0060884 A1 * | 3/2005 | Okamura et al. .............. 29/846 |
| 2006/0057354 A1 * | 3/2006 | Kalkan et al. ............ 428/304.4 |
| 2007/0218202 A1 * | 9/2007 | Ajayan et al. ............ 427/249.1 |
| 2008/0036358 A1 * | 2/2008 | Takai ........................ 313/495 |

FOREIGN PATENT DOCUMENTS

| | | |
|---|---|---|
| WO | WO 2004/088755 | 10/2004 |

* cited by examiner

NANOWIRE SEMICONDUCTOR DEVICE

The invention relates to a semiconductor device and method of manufacture, the semiconductor device including in particular at least one nanowire.

Nanowires, also known as whiskers, are very narrow wires. They may be formed in a variety of materials, including a variety of different semiconductors. An early review of methods of growing these wires and their use is provided by the applied physics review of Hiruma et al, "Growth and optical properties of nanometer-scale GaAs and InAs whiskers", in J. Appl. Phys, volume 77, number 2 (1995), pages 447 to 461.

Further details of their growth are provided in Morales and Lieber, "A laser ablation method for the synthesis of crystalline semiconductor nanowires", Science, Volume 279, pages 208 to 210, (1998). Details of growing nanowire superlattices, i.e. nanowire containing more than one material, are contained in Gudiksen et al, "Growth of nanowire superlattice structures for nanoscale photonics and electronics", Nature, volume 415, pages 617 to 620 (2002).

The latter paper contains many more references to the so-called vapour-liquid-solid (VLS) growth process. In the VLS process, a liquid metal cluster or catalyst acts as the nucleus for growth of semiconductor from gas phase reactants. In principle, the size of the metal cluster determines the width of the nanowire. By ensuring very low diameter catalysts, narrow wires can be grown.

The low diameter clusters may be created by heating up metal atoms on a substrate either by raising the temperature or by laser ablation to create small metal or alloy clusters of catalyst. The metal atoms may be for example of gold.

The paper by Gudiksen et al describes how nanowire composition may be varied during growth to provide high-quality heterostructures.

It has been proposed to incorporate nanowires in a number of different types of semiconductor device. In particular, US2003/0132461 (Roesner et al) describes a field effect transistor using nanowires. This patent application proposes a method in which a nickel source layer is deposited on a substrate, followed by an aluminium oxide layer. A gate layer is deposited on the aluminium oxide, and through holes etched in the gate layer and aluminium oxide layer. Carbon nanotubes are then grown in the through holes. The gate layer is then oxidised so that the sidewalls of the through holes are insulating. Drain contacts are then made.

However, the inventors are not aware of good results obtained using such devices.

According to a first aspect of the invention there is provided a semiconductor device comprising: a substrate defining opposed first and second major surfaces; at least one conductive nanowire extending substantially perpendicularly to the major surfaces defining a body region and a drift region along the length of the nanowire; a gate region of conductive material insulated from the nanowires and arranged adjacent to the body region of the nanowires and spaced from the drift region end of the nanowires to control conduction in the nanowires in the body region of the nanowires.

The invention is of use in power applications and can result in a better tradeoff between breakdown voltage and on-state resistance than can be obtained through more conventional methods.

By forming a gated nanowire device in this way a higher breakdown voltage can be achieved. The region of the nanowire not adjacent to the gate acts in effect as a drift region thereby increasing the breakdown voltage of the device. The maximum electric field strength that can be supported by bulk silicon is not particularly high, and gallium nitride (GaN) has for example a maximum electric field strength around one order of magnitude higher than for silicon. The use of a nanowire in the arrangement of the invention allows high breakdown strengths to be achieved.

In particular, the nanowire may be formed of a first material in the body region adjacent to the gate and a different second material in the drift region not adjacent to the gate. In this way each region of the device can be optimised independently.

In the channel region a material with a high inversion layer mobility is required, whereas in the drift region the critical field strength and bulk mobility are more important.

In a particular embodiment the first material is silicon and the second material is gallium nitride.

Other materials for the nanowire may also be used, for example carbon.

Not just the material itself, but also the doping profile can be optimised independently. For instance, a doping gradient in the drift region can be realised by choosing the growth conditions accordingly.

Any suitable conductive material may be used for the gate, for example metal such as aluminium. Alternative materials such as highly doped polysilicon may also be used, and indeed may be preferred.

In another aspect, the invention relates to a substrate defining opposed first and second major surfaces; at least one conductive nanowire extending substantially perpendicularly to the major surfaces defining a first region and a second region along the length of the nanowire; wherein the nanowires are formed of a first material in the first region and a different second material in the second region not adjacent to the gate.

The nanowires may be embedded in dielectric material, which may for example be deposited after forming the nanowires.

Alternatively, the nanowires may be in at least one trench.

In this case, a dielectric layer may be provided on the sidewalls of the at least one trench, a dielectric layer on the surface of the substrate, and a conductive gate region formed on the dielectric layer on the surface of the substrate.

A plurality of nanowires may be provided in the or each trench.

Alternatively, a single nanowire may be provided in the or each trench, and may indeed fill the trench.

Suitable materials for the substrate include silicon and aluminium oxide. The latter is a known substrate for growing nanowires. Indeed, the aluminium oxide may be a layer formed on aluminium, the underlying aluminium forming the second contact.

Note that the substrate can be doped silicon, especially where the substrate acts as a gate and so needs to conduct, but may also be of undoped silicon, especially where a separate gate contact is provided or the semiconductor device does not have a gate.

In particularly preferred embodiments the substrate is highly doped with a lower doped epilayer of the same conductivity type as the substrate formed on the substrate.

The invention also relates to a method of manufacturing a semiconductor device according to the first aspect. Thus, the invention also relates to: providing a substrate defining opposed first and second major surfaces; growing at least one conductive nanowire substantially perpendicularly to the major surfaces; a gate region of conductive material insulated from the nanowires and arranged adjacent to a body region of the nanowires and spaced from a drift region end of the nanowires to control conduction in the nanowires in the body region of the nanowires.

In another aspect there is provided a semiconductor device comprising: a semiconductor substrate having opposed first and second major surfaces; at least one trench extending from the first major surface of the substrate towards the second major surface through the semiconductor substrate; a first contact at the first major surface of the substrate; and a plurality of conductive nanowires extending from the first contact to the base of the trench through the trench.

Note that in the present specification the term "trench" is not intended to be limited to elongate forms and is specifically intended to include a contact hole in a dielectric.

By growing nanowires in a trench in a semiconductor substrate nanowires can be used where they are grown. The nanowires can easily be integrated with other components formed on the substrate.

The invention provides freedom to use a variety of different materials to grow the nanowire.

In another aspect, there is provided a semiconductor device comprising:
a metal plate;
an insulating layer on the metal plate;
at least one trench extending through the insulating layer;
a first contact at the top of the trench;
a second contact at the base of the trench; and
conductive nanowires extending from the first contact to the second contact through the trench.

The metal plate may be aluminium and the insulating layer aluminium oxide.

In another aspect, the invention relates to a method of manufacturing a semiconductor device having first and second contacts, comprising:
providing a substrate having opposed first and second major surfaces;
forming a trench extending from the first major surface towards the second major surface;
forming a second contact at the base of the trench;
forming insulator on the sidewalls of the trench;
depositing catalyst in the base of the trench on the second contact;
growing nanowires from the catalyst extending from the base of the trench to the top of the trench; and
forming a first contact in contact with the nanowires at the top of the trench.

The method may further comprise depositing insulator on top of the first major surface of the substrate; and depositing a gate layer on the insulator.

The method may readily provide nanowires with a first material adjacent to the gate layer and a second material not adjacent to the gate layer by:
supplying a precursor of the second material layer when initially growing the nanowire from the catalyst; and subsequently
supplying a precursor of the first material layer.

It is convenient to grow the nanowires using a VLS process.

In another aspect, there is provided a method of manufacturing a semiconductor device comprising:
depositing catalyst on a substrate having a first major surface in electrical connection with a second contact;
growing a plurality of nanowires;
depositing dielectric around the nanowires leaving the tops of the nanowires exposed; and
forming a first contact in contact with the tops of the nanowires.

The method may include:
depositing gate insulator on at least part of the exposed tops of the nanowires;
depositing a gate layer on the dielectric;
depositing an upper insulating layer on the gate layer, and
forming the first contact to the nanowires on the upper insulating layer.

The dielectric deposited around the nanowires may be formed from a tetraethylorthosilicate (TEOS) precursor.

Figure 2:
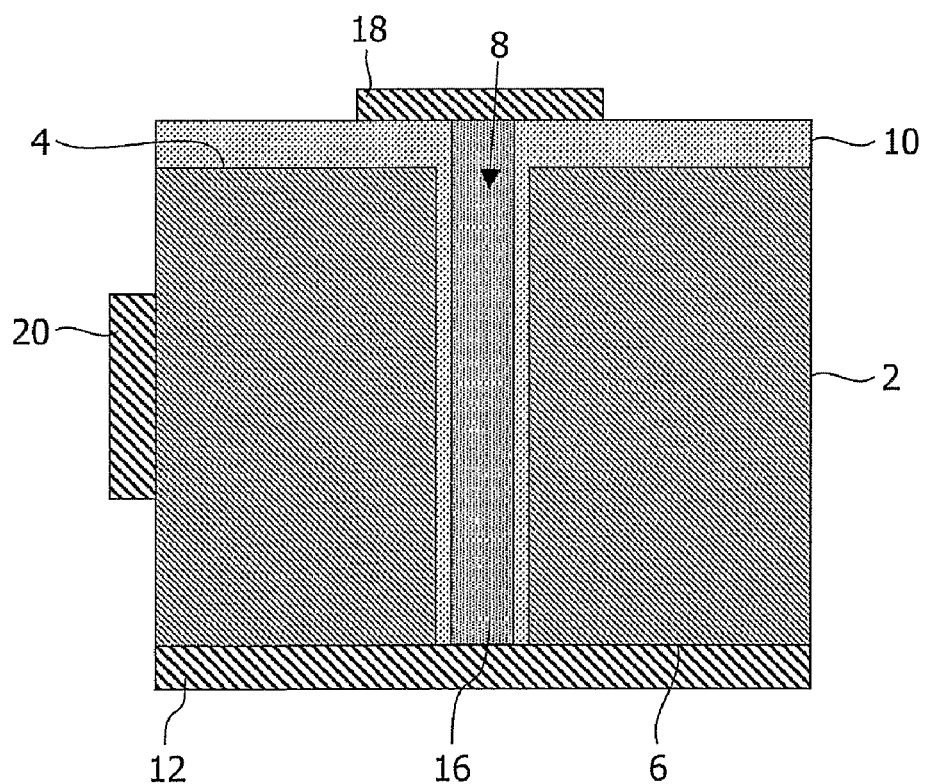
Figure 3:
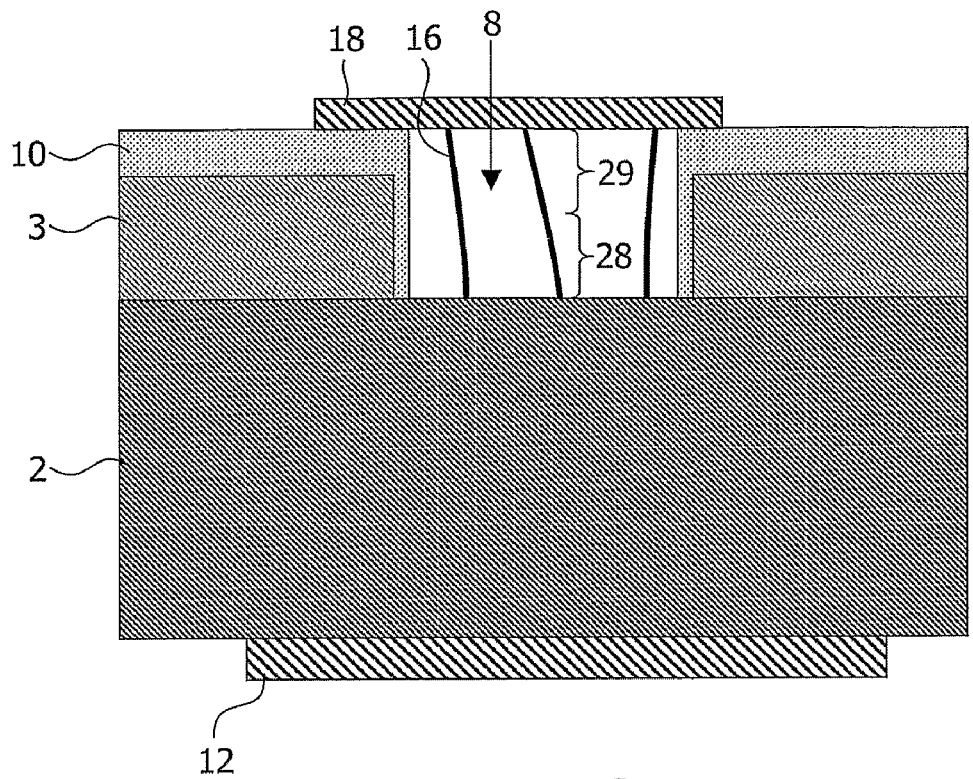
Figure 4:
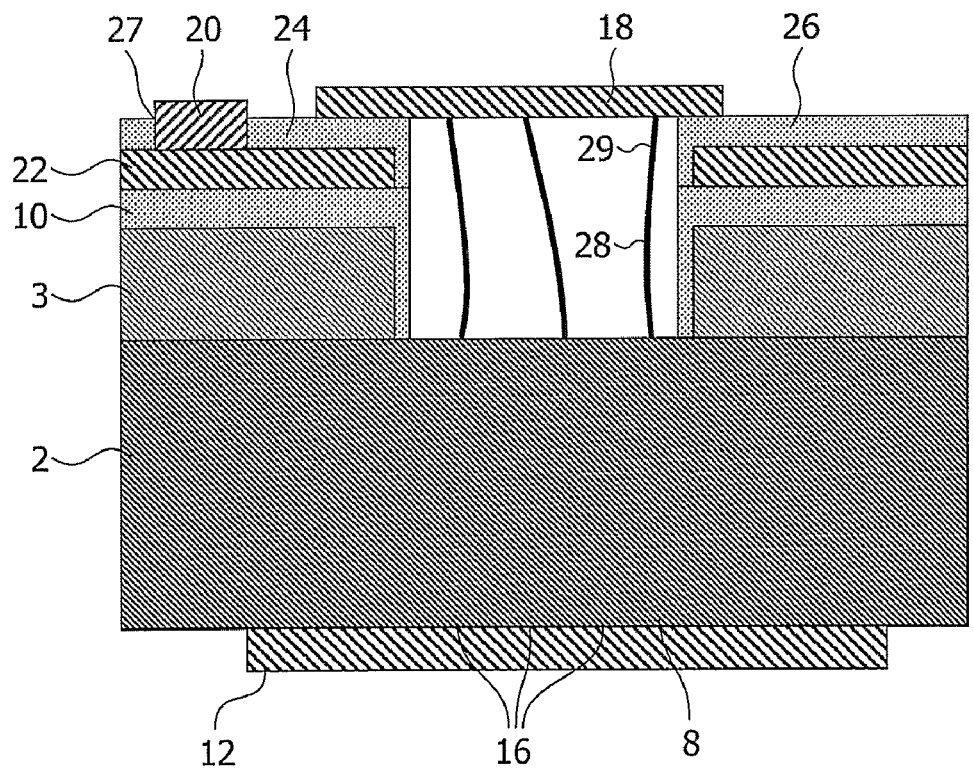
Figure 5:
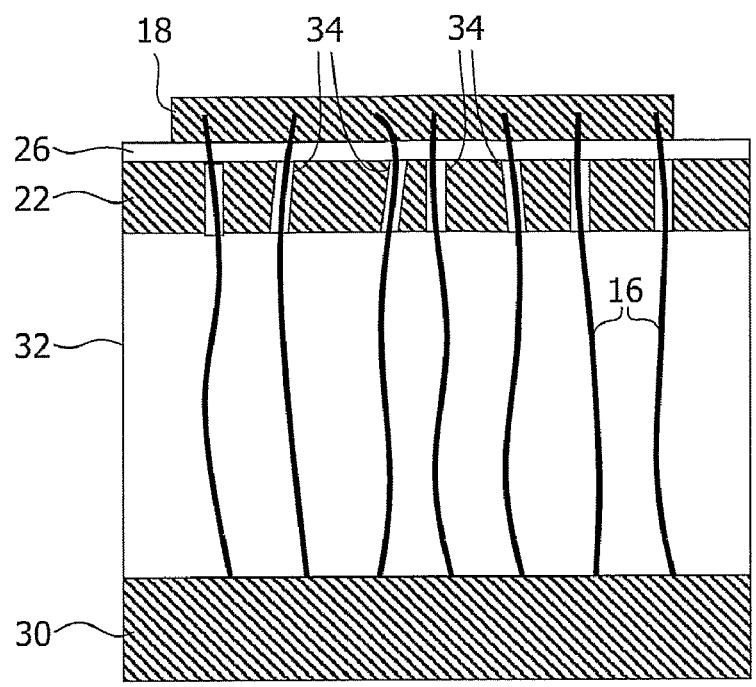
Figure 6:
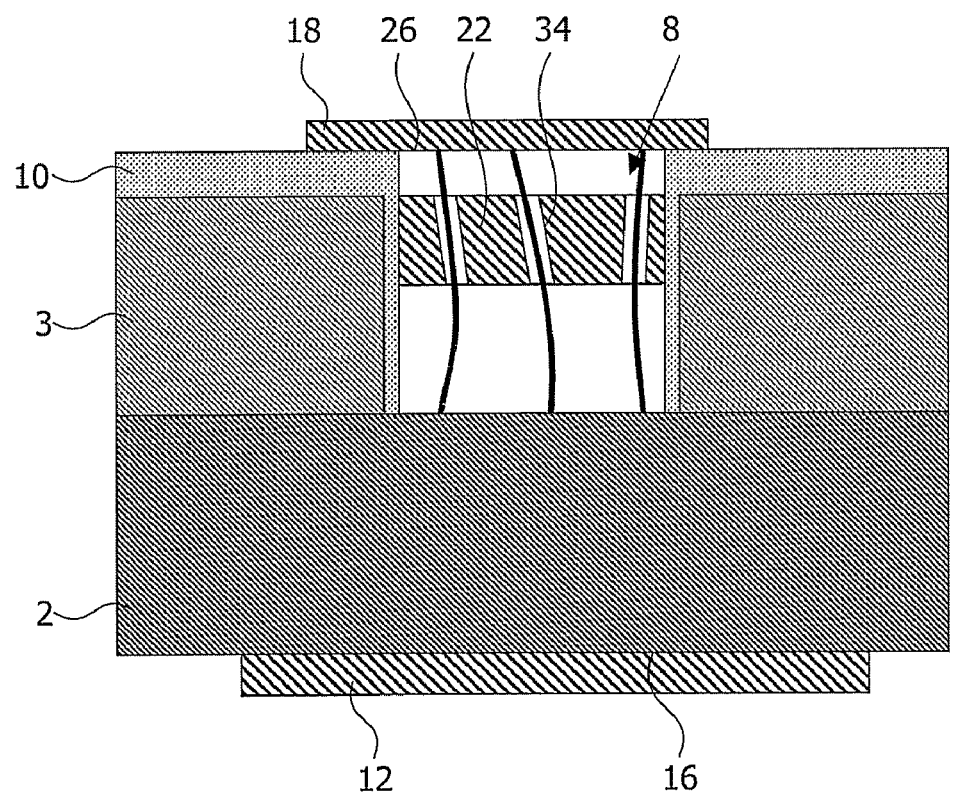
Figure 7:
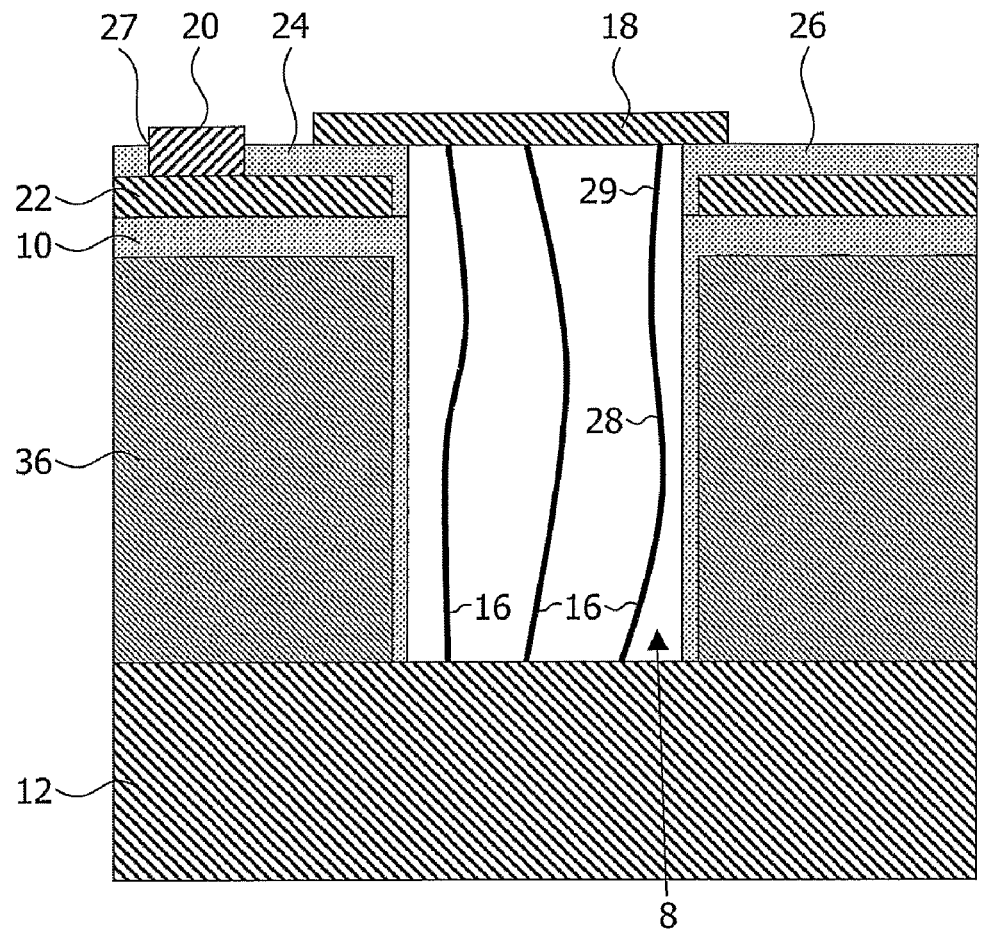

For a better understanding of the invention embodiments will now be described with reference to the accompanying drawings in which:

FIG. 1 illustrates growth of nanowires.
FIG. 2 shows a first embodiment of the invention;
FIG. 3 shows a second embodiment of the invention;
FIG. 4 shows a third embodiment of the invention;
FIG. 5 shows a fourth embodiment of the invention;
FIG. 6 shows a fifth embodiment of the invention; and
FIG. 7 shows a sixth embodiment of the invention.

Like components are given like reference numerals in the different embodiments and the description relating to each reference numeral is not always repeated with reference to each figure. The figures are not to scale and in particular the full substrate thickness is generally not shown.

FIG. 1 illustrates nanowire growth on a metal electrode 12. A metal film of catalyst is deposited by a technique such as evaporation. The metal may be for example nickel, cobalt, iron or gold. The film thickness may be in the range 0.2 nm to 5 nm. This deposition will deposit film both on the top surface of the device and on the base of the trench. The film at the top surface can be removed at this stage, e.g. using lift-off or Chemical-Mechanical Polishing An alternative approach to depositing the metal is by electrodeposition applying a cathodic potential to the electrode 12.

In alternate arrangements small colloidal particles may be deposited, directly or by electrophoresis.

Next, the substrate is heated in a reaction chamber (not shown) which forms small metal droplets 14 of the metal catalyst on drain contact 12.

The material of the nanowire grown depends on the precursor, and the skilled person will be familiar with suitable precursors for growing a number of types of nanowires, for example from the articles and patents referred to above. A suitable precursor is introduced into the reaction chamber and the precursor forms the chosen semiconductor preferentially under the catalyst 14. As semiconductor continues to be deposited, the semiconductor forms thin nanowires 16.

The nanowires may in alternative embodiments and under suitable conditions be nanotubes.

Further details of nanowire growth can be found in the articles and patents referred to above.

A first embodiment will now be described referring to FIG. 2. A silicon substrate 2 doped to be conductive has opposed first and second major surfaces 4, 6. A through trench 8 is etched to extend between the surfaces. Although only one trench is shown there will generally in practice be many more. Dielectric 10 is coated on the sidewalls of the trench 8 as well as on the first major surface 4. Any dielectric is then removed from the base of the trench.

Next, the vapour liquid solid (VLS) method is used to grow a nanotube in the trench. The catalyst is heated until it form small droplets, also known as clusters, and then precursor is provided in vapour form which grows preferentially at the clusters to provide nanowires 16.

Note that in this example a single nanowire is formed in each trench.

Any nanowires deposited on the top surface can easily be wiped/polished off.

A source contact 18 is provided on the first major surface to connect to the top of the nanowires and a gate contact 20 is provided to connect to the substrate.

A drain contact 12 is deposited on the second major surface and a catalyst deposited on the drain contact in the trench to provide the device illustrated in FIG. 2. The drain contact 12 may be deposited at this late stage because the drain metal's presence can be incompatible with the wire growth and much of the subsequent processing.

In use, voltage can be applied to the gate contact to control conduction between source and drain contacts.

In an alternative arrangement the gate is omitted and the nanowire is formed to be a diode. This is achieved in a like manner to that described below.

In alternative arrangements the nanowire is formed in a trench through an epilayer, as in the subsequent embodiments.

FIG. 3 shows an alternative arrangement. A highly doped semiconductor substrate 2 is provided having a lower doped epilayer 3 on top. A trench 8 is formed in epilayer 3, dielectric 10 deposited on the sidewalls of the trench 8, catalyst is deposited at the base of the trench and a number of nanowires 16 are formed in each trench by growing them from the catalyst. In this example, the depth of the trench 8 is the same as the thickness of the epilayer 3, though this is not essential as long as connection can be made to both ends of the nanowire.

Note that the term "substrate" is often used in this specification to refer to the substrate and the epilayer.

In this instance the nanowires 16 are diodes having one end doped n-type and one end doped p-type.

A region 28 of the nanowire adjacent to the substrate 2 is grown using a p-type dopant in the gas mixture used to grow a p-type length 28 of nanowire. After a length of nanowire is grown, the dopant is changed to an n-type dopant and growth continued of an n-type length of nanowire 29. A p-n junction formed at the boundary between the lengths 28,29 of nanowire forms a diode.

Therefore, the upper contact 18 is in this instance an anode contact, not a source contact, and lower contact 12 is in this instance a cathode contact, not a drain contact.

The processing can also start with n-type and then p-type.

The invention can also provide a Schottky diode by using a nanowire 29 of a single conductivity type and using the Schottky barrier with upper contact 18 to act as the rectifier.

FIG. 4 shows an alternative arrangement, again using a substrate 2 and epilayer 3 combination, wherein a transistor is formed not a diode. In this instance, conductive gate 22 is deposited on the dielectric 10 on the first major surface, followed by the deposition of a layer that forms gate insulator 24 between the gate 22 and the trench 8 as well as an insulating layer 26 above the gate 22. The gate contact 20 is connected to gate through a via 27 in the insulating layer 26. Source contact 18 is formed over insulating layer 26.

In this example, the material of the nanowire is not the same along the whole length of the nanowire. A drift region 28 of the nanowire adjacent to the substrate 2 is grown using GaN precursor. When the length of the nanowire reaches the top of the substrate, the precursor used in the VLS growth process is changed to a precursor for growing silicon and body region 29 is grown. Therefore, the body region 29 of the nanowire adjacent to the gate 22 is of silicon.

In this way, GaN is used in the region of the nanowire that acts as a drift region to support voltage when the device is off, and silicon is used in the region controlled by the gate. In this way, the improved breakdown performance of the GaN can be used to enhance the breakdown voltage for a given specific on-resistance This is just one example. Other combinations of materials are also possible, as well as doping profile variations.

In preferred embodiments the nanowire is attached to the sidewalls. This may be done, for example, by applying a voltage between nanowire and substrate to electrostatically attract the nanowire to the sidewalls.

In a further approach, illustrated in FIG. 5, a conductive substrate 30 is used as drain contact. Nanowires 16 are grown on the conductive substrate using the VLS process. Then, a dielectric 32 is deposited around the nanowires leaving their tops exposed. In the embodiment described a spin-on process is used. The deposited dielectric may be, for example tetraethylorthosilicate (TEOS), though other materials can be used instead if required.

Next, a gate dielectric 34 is deposited around the exposed tops of the nanowires 16 and a conductive gate 22 deposited. An upper insulating layer 26 is formed to insulate the gate 22 from the source contact 18 which is formed over upper insulating layer 26 in contact with the top of the nanowires 16. Contact to the gate layer 22 is made at the perimeter of the device.

FIG. 6 shows a further development which essentially forms the structure of FIG. 5 inside a trench as shown in FIGS. 1 to 4. In this case, the method used to manufacture the device of FIG. 5 is used after forming a trench or trenches in a substrate as used to make the device of FIG. 1.

Note in this case that gate electrode 22 is inside the trench 8 and may be contacted for example at one or both ends of the trench.

In a variation of the approach of FIG. 4, illustrated in FIG. 7, an aluminium plate 12 is used and an insulating aluminium oxide ($Al_2O_3$) layer 36 grown on top of the aluminium. This combination is suitable for growing nanowires. Note that although the plate 12 is shown as thinner than the layer 2 in FIG. 7 this is simply to show the nanotube region more clearly and in practical arrangements the layer 36 will in general be thinner than the plate. The aluminium plate 12 can be used as the drain contact 12. A trench is formed through the aluminium oxide layer 2 and insulated. Nanowires are then grown by the VLS process followed by the formation of the gate 22 and source contact 18 as above.

Other materials can be used for substrate 2 and drain contact 12 if convenient.

The features of the various embodiments described above may be combined. For example, the feature of a nanowire filling a narrow trench, described above in the embodiment of FIG. 2 in which the trench passes through the full thickness of the substrate, can just as well be implemented in an embodiment in which the trench is formed only at the top of the substrate as in the embodiments of FIGS. 3 and 4. Other combinations of features will be apparent to those skilled in the art.

From reading the present disclosure, other variations and modifications will be apparent to persons skilled in the art. Such variations and modifications may involve equivalent and other features which are already known in the design, manufacture and use of semiconductor devices and nanowires and which may be used in addition to or instead of features described herein. Although claims have been formulated in this application to particular combinations of features, it should be understood that the scope of disclosure also includes any novel feature or any novel combination of features disclosed herein either explicitly or implicitly or any generalisation thereof, whether or not it mitigates any or all of the same technical problems as does the present invention. The applicants hereby give notice that new claims may be formulated to any such features and/or combinations of such features during the prosecution of the present application or of any further applications derived therefrom.

The invention claimed is:

1. A semiconductor device comprising:
   a substrate defining opposed first and second major surfaces;
   at least one conductive nanowire extending substantially perpendicularly to the major surfaces (4) defining a body region (29) and a drift region (28) along the length of the nanowire (16);
   a gate region of conductive material insulated from the nanowires (16) and arranged adjacent to the body region (29) of the nanowires (16) and spaced from the drift region (28) end of the nanowires (16) to control conduction in the nanowires in the body region (29) of the nanowires.

2. A semiconductor device according claim 1 wherein the nanowire or nanowires are embedded in dielectric material.

3. A semiconductor device according to claim 1 wherein the nanowires are formed of a first material in the body region adjacent to the gate and a different second material in the drift region not adjacent to the gate.

4. A semiconductor device according to claim 3 wherein the second material has a higher maximum electric field strength before breakdown than the first material.

5. A semiconductor device according to claim 1 comprising at least one trench extending from the first major surface (4) towards the second major surface, the nanowires extending in the trench.

6. A semiconductor device according to claim 5 further comprising a dielectric layer on the sidewalls of the at least one trench a dielectric layer on the surface of the substrate, wherein the conductive gate region is formed on the dielectric layer on the surface of the substrate.

7. A semiconductor device according to claim 5 wherein a plurality of nanowires are provided in the or each trench.

8. A semiconductor device according to claim 5 wherein a single nanowire fills the or each trench.

9. A semiconductor device according to claim 5 wherein the substrate is silicon.

10. A semiconductor device according to claim 5 wherein the substrate is of aluminium oxide.

11. A semiconductor device comprising:
    a substrate defining opposed first and second major surfaces
    at least one conductive nanowire extending substantially perpendicularly to the major surfaces defining a first region and a second region along the length of the nanowire
    wherein the nanowires are formed of a first material in the first region and a different second material in the second region.

12. A semiconductor device comprising:
    a semiconductor substrate having opposed first and second major surfaces
    at least one trench extending from the first major surface of the substrate through the semiconductor substrate
    insulator on the sidewalls of the trench;
    a first contact at the first major surface of the substrate and
    at least one conductive nanowire extending from the first contact to the base of the trench through the trench.

13. A semiconductor device according to claim 12 further comprising a gate for controlling conduction in the at least one nanowire through the trench.

14. A semiconductor device according to claim 12 wherein a plurality of conductive nanowires are provided in each trench.

15. A semiconductor device according to claim 12 wherein the substrate is silicon.

16. A semiconductor device comprising:
    a substrate defining opposed first and second major surfaces
    a gate;
    a plurality of conductive nanowires extending substantially perpendicularly to the major surfaces through the gate; and
    a gate dielectric on each nanowire electrically isolating the gate from the respective nanowire.

17. A semiconductor device according to claim 16 wherein the substrate is a metal plate.

* * * * *